United States Patent
Kim et al.

(10) Patent No.: US 6,890,856 B2
(45) Date of Patent: May 10, 2005

(54) METHOD FOR ELIMINATING PROCESS BYPRODUCT DURING FABRICATION OF LIQUID CRYSTAL DISPLAY

(75) Inventors: Hwan Kim, Daegu (KR); Ki Choon Park, Seoul (KR); Young Sup Jung, Seoul (KR); Chang Kuk Yang, Kyoungsangbuk-do (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/653,909

(22) Filed: Sep. 4, 2003

(65) Prior Publication Data
US 2004/0046924 A1 Mar. 11, 2004

(30) Foreign Application Priority Data
Sep. 7, 2002 (KR) .................. 10-2002-0054034

(51) Int. Cl.[7] ........................................... H01L 21/302
(52) U.S. Cl. ..................... 438/689; 438/706; 438/711; 438/715
(58) Field of Search ................. 438/715, 689, 438/706, 711, 905–906

(56) References Cited

U.S. PATENT DOCUMENTS
2004/0137741 A1 * 7/2004 Chebi et al. ................. 438/694

* cited by examiner

*Primary Examiner*—Thanh Nguyen
(74) *Attorney, Agent, or Firm*—Morgan Lewis & Bockius LLP

(57) ABSTRACT

A fabricating method of a liquid crystal display includes the steps of inserting a first substrate into a chamber to perform a dry etching process, removing the first substrate from the chamber after completion of the dry etching process, inserting a dummy substrate into the chamber, injecting inert gas into the chamber to eliminate a process byproduct and a remaining gas, taking the dummy substrate out from the chamber, and inserting a second substrate into the chamber having the process byproduct and the remaining gas removed, to perform an ashing process.

20 Claims, 7 Drawing Sheets

METHOD FOR ELIMINATING PROCESS BYPRODUCT DURING FABRICATION OF LIQUID CRYSTAL DISPLAY

This application claims the benefit of Korean Patent Application No. 2002-54034 filed in Korea on Sep. 7, 2003, which is hereby incorporated by reference.

BACKGROUND OF THE INVENTION

1. Field of the Invention

The present invention relates to a liquid crystal display, and more particularly to a fabricating method of a liquid crystal display for substantially eliminating a process byproduct remaining within a chamber.

2. Description of the Related Art

Generally, liquid crystal displays controls the light transmittance of liquid crystals using an electric field to display a picture. To this end, the liquid crystal display includes a liquid crystal display panel with liquid crystal cells arranged in a matrix, and a drive circuit to drive the liquid crystal display panel. Pixel electrodes and common electrodes are provided to apply an electric field across each of the liquid crystal cells in the liquid crystal display panel. Normally, a pixel electrode is formed on a lower substrate of the liquid crystal cells, whereas the common electrode is integrated into the entire surface of an upper substrate. Each pixel electrode is connected to a thin film transistor (hereinafter, referred to as TFT) that is used as a switching device. The pixel electrode drives the liquid crystal cell together with the common electrode in accordance with data signals applied through the thin film transistor.

The lower substrate of such a liquid crystal display requires a plurality of mask processes as well as semiconductor processings. Thus, the fabricating process is complicated and a major factor in the cost of the liquid crystal display panel. This is because one mask process is used for several processes, such as a deposition process, a cleaning process, a photolithography process, an etching process, an exfoliation process and a testing process. To address this cost issue, a fabrication process for the lower substrate has been developed to reduce the number of mask processes. Accordingly, a four-mask process is now used for what was once a five-mask process.

FIGS. 1 and 2 are plan and sectional views representing a lower substrate formed by a four-mask process. Referring to FIGS. 1 and 2, a lower substrate 1 of a liquid crystal display includes a TFT T located adjacent each intersection of the data lines 4 and the gate lines 2, and a pixel electrode 22 connected to the drain electrode 10 of the TFT T. The TFT T includes a gate electrode 6 connected to the gate line 2, a source electrode 8 connected to the data line 4, and a drain electrode 10 connected to the pixel electrode 22 through a drain contact hole 20. Further, the TFT T includes semiconductor layers 14 and 16 that form a conductive channel between the source electrode 8 and the drain electrode 10 when a gate voltage is applied to the gate electrode 6. In response to a gate signal from the gate line 2, the TFT T supplies a data signal from the data line 4 to the pixel electrode 22.

The pixel electrode 22 is located in a cell area defined by the data line 4 and the gate line 2 and formed of a transparent conductive material with high light transmittance. The pixel electrode 22 is formed on a protective layer 18 that is spread over the entire surface of the lower substrate 1, and is electrically connected to the drain electrode 10 through a drain contact hole 20 that penetrates the protective layer 18.

A potential difference is generated between the pixel electrode 22 and a common transparent electrode (not shown) formed in an upper substrate (not shown) by the data signal supplied through the TFT T. The potential difference causes the liquid crystals located between the lower substrate 1 and the upper substrate (not shown) to rotate due to dielectric constant anisotropy. The rotating liquid crystals cause light incident through the pixel electrode 22 from a light source to be transmitted to the upper substrate.

The fabricating method of the lower substrate of the liquid crystal display will be described in conjunction with FIGS. 3A to 3D. FIGS. 3A to 3D are a sectional view representing processing steps for a lower substrate of the liquid crystal display shown in FIG. 2. As shown in FIG. 3A, a gate pattern, including the gate electrode 6 and the gate line 2, is formed on the lower substrate 1. To this end, a gate metal layer is deposited on the lower substrate 1 by a deposition method, such as sputtering. The gate metal layer is formed of aluminum Al or aluminum alloy. The gate metal layer is patterned by a photolithography and etching process using a first mask to form a gate electrode 6 and the gate line 2 on the lower substrate 1.

Referring to FIG. 3B, a gate insulating film 12, an active layer 14, an ohmic contact layer 16, a data line 4, a source electrode 8 and a drain electrode 10 are formed on the lower substrate provided with the gate electrode 6 and the gate line 2. The gate insulating film 12, first and second semiconductor layers and a data metal layer are sequentially deposited on the lower substrate 1 by a deposition method, such as chemical vapor deposition or sputtering. The gate insulating film 12 is formed of an inorganic insulating material, such as silicon oxide SiOx or silicon nitride SiNx. A first semiconductor layer is formed of undoped amorphous silicon doped with no impurities. A second semiconductor layer is formed of amorphous silicon doped with n-type or p-type impurities. The data metal layer is formed of molybdenum Mo or molybdenum alloy.

A photo resist pattern is formed on the data metal layer by a photolithography process using a second mask. In this case, a diffractive mask with a diffracting part at a channel part of the TFT is used as the second mask. Thus, the photo resist pattern of the second mask for the channel part is relatively lower in height than a source and drain pattern part. The data metal layer is patterned by a wet etching process using photo resist pattern of the second mask, whereby a data pattern including the data line 4, the source electrode 8 and the drain electrode 10 is formed.

Then, the first and second semiconductors are patterned by a dry etching process using the photo resist pattern of the second mask to form an active layer 14 and an ohmic contact layer 16. The photo resist pattern of the second mask with a relatively low height at the channel is removed by an ashing process, and then the data metal layer at the channel part is etched by a wet etching process and the ohmic contact layer is etched by the dry etching process. Accordingly, the active layer 14 of the channel part is exposed to separate the source electrode 8 from the drain electrode 10. Then, the remaining photo resist pattern is removed from the data metal layer by a stripping process.

Referring to FIG. 3C, a protective film 18 is formed on the gate insulating film 12 where the data pattern is formed. To this end, an insulating material is deposited on the gate insulating film 12 to form the protective film 18. The protective film 18 is formed of an inorganic insulating material, such as silicon nitride SiNx and silicon oxide SiOx, or an organic insulating material, such as acrylic organic compound, benzocyclobutene BCB, and perfluorocyclobutane PFCB. Subsequently, the protective film 18 is patterned by the photolithography process and the etching process using a third mask to form the drain contact hole 20. The drain contact hole 20 is formed to penetrate the protective film 18 and to expose the drain electrode 10.

As shown in FIG. 3D, the pixel electrode 22 is formed on the protective film 18. To this end, a transparent metal layer is formed on the protective film 18 by a deposition method such as sputtering. The transparent metal layer is formed of indium-tin-oxide ITO, indium-zinc-oxide IZO or indium-tin-zinc-oxide ITZO. Subsequently, the transparent metal layer is patterned by a photolithography and etching process using the fourth mask to form the pixel electrode 22. The pixel electrode 22 is connected to the drain electrode 10 through the drain contact hole 20 that penetrates the protective film 18. Contact holes formed on the gate pattern and the protective layer of the related art liquid crystal display are patterned by the dry etching process, and the semiconductor layer forming the channel between the source and drain electrodes is patterned by the ashing process and the dry etching process.

After the dry etching process and the ashing process, a method of eliminating a process byproduct, as shown in FIG. 4, is performed in order to remove the process byproduct remaining within the chamber. FIG. 4 is a flow chart representing a process to eliminate a process byproduct generated during a dry etching process and an ashing process of the liquid crystal display according to the related art.

First, as referred to in FIG. 4, after inserting a first substrate where the gate metal layer Mo or the protective film is formed into the chamber, the contact hole penetrating the gate pattern or the protective film is formed on the first substrate (step S41). The first substrate is removed from the chamber after completion of the dry etching process. After inserting a dummy substrate into the chamber, the photo resist and Molybdenum Mo remaining with the chamber are removed using $SF_6$ gas and $O_2$ gas with RF power (step 2 S42). At this moment, $SF_6$ gas to $O_2$ gas ratio is about 5:1. The dummy substrate is removed from the chamber after the process byproduct elimination process. And then, the ashing process is performed after inserting a second substrate into the chamber, wherein the second substrate has the photo resist pattern thereon to form the source and drain electrodes (step S43). At this moment, $SF_6$ gas to $O_2$ gas ratio used in the ashing process is about 1:20.

Because of the process gas, which is not removed and remains after the process byproduct elimination process, an ashing time is reduced in the photo resist pattern for which the ashing process is first performed after the process byproduct elimination process. Further, the dry etching process time of the protective film takes relatively longer and, at the same time, the temperature within the chamber is likely to increase because RF power is used during the dry etching process. In the case that the etching process and the ashing process are continuously performed, the rising temperature within the chamber increases generation of radicals during the ashing process that further shortens the ashing time. The ashing time of the long side or outer area of the substrate is especially reduced. The reduced ashing time causes the photo resist pattern to be ashed away excessively. If a lower part film located at the lower part of the photo resist pattern is patterned, there is a problem in that the lower part film is excessively etched.

SUMMARY OF THE INVENTION

Accordingly, the present invention is directed to a a fabricating method of a liquid crystal display that substantially obviates one or more of the problems due to limitations and disadvantages of the related art.

An object of the present invention is to provide a fabricating method of a liquid crystal display for substantially eliminating a process byproduct remaining within a chamber.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other objects of the invention, a fabricating method of a liquid crystal display according to an aspect of the present invention includes the steps of inserting a first substrate into a chamber to perform a dry etching process, removing the first substrate from the chamber after completion of the dry etching process, inserting a dummy substrate into the chamber, injecting inert gas into the chamber to eliminate a process byproduct and a remaining gas, taking the dummy substrate out from the chamber and inserting a second substrate into the chamber having the process byproduct and the remaining gas removed, to perform an ashing process.

It is to be understood that both the foregoing general description and the following detailed description are exemplary and explanatory, and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE PREFERRED EMBODIMENT

Reference will now be made in detail to the preferred embodiments of the present invention, examples of which are illustrated in the accompanying drawings.

Figure 1:
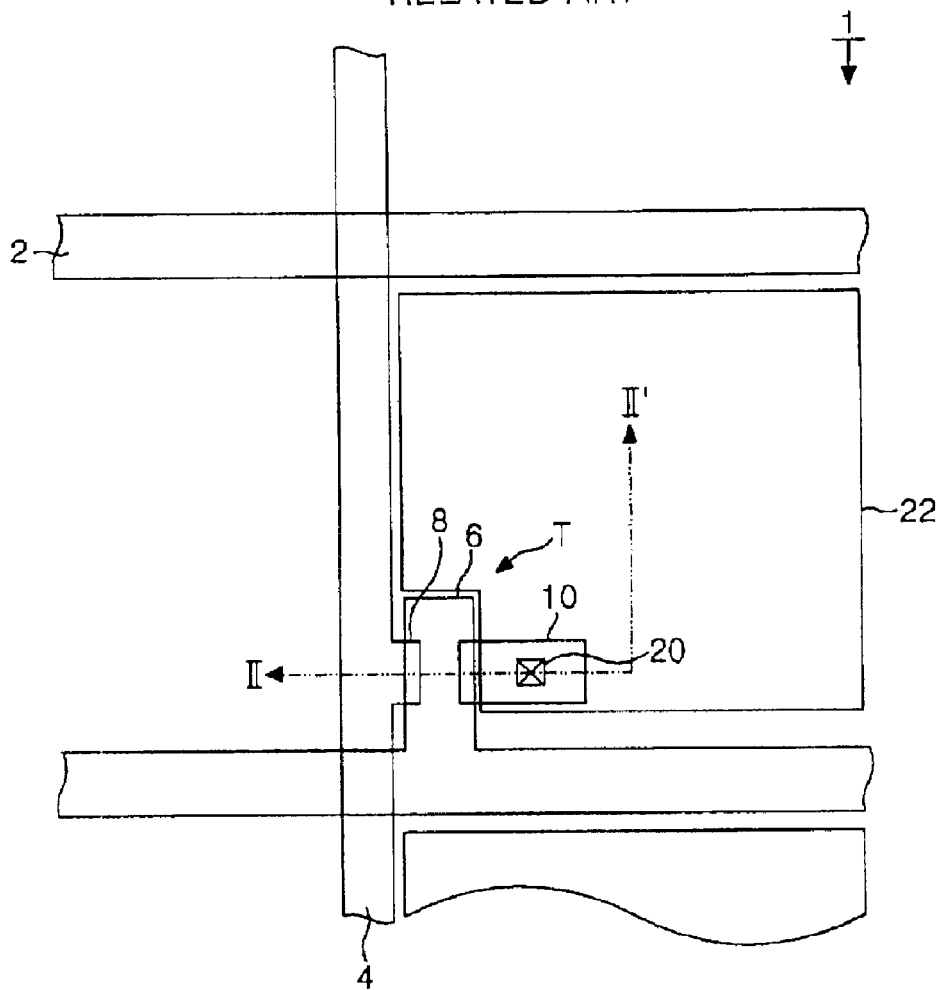
FIG. 1 is a plan view representing a lower substrate of a liquid crystal display of the related art.
Figure 2:
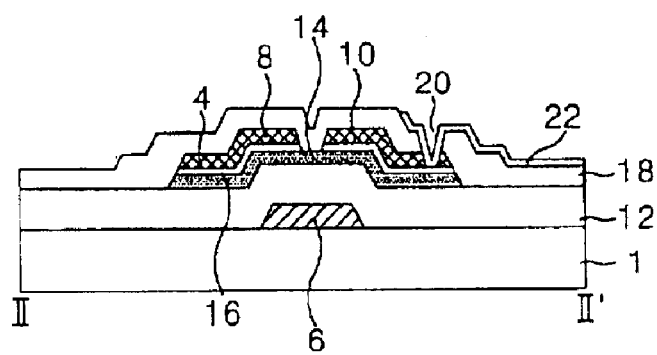
FIG. 2 is a sectional view representing a lower substrate of a liquid crystal display taken along the line II–II' in FIG. 1.
Figure 3A:
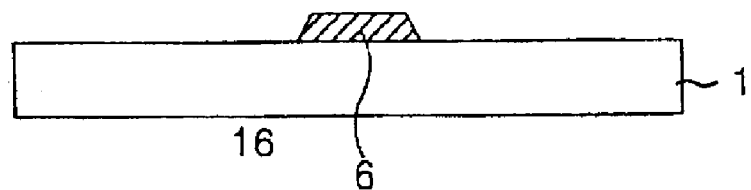
FIGS. 3A to 3D are a sectional view representing processing steps for a lower substrate of the liquid crystal display shown in FIG. 2.
Figure 3B:
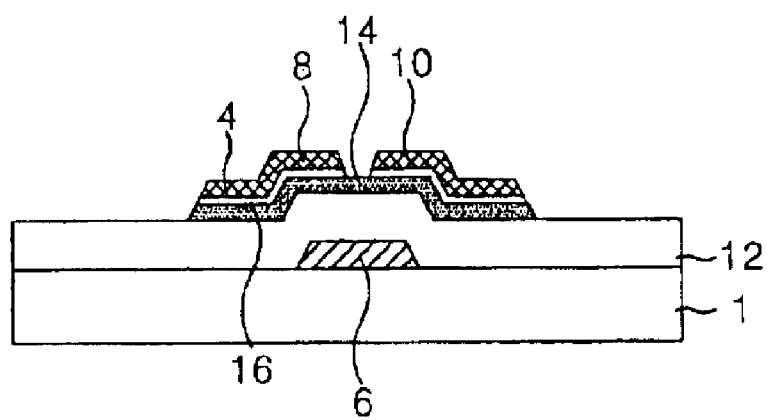
Figure 3C:
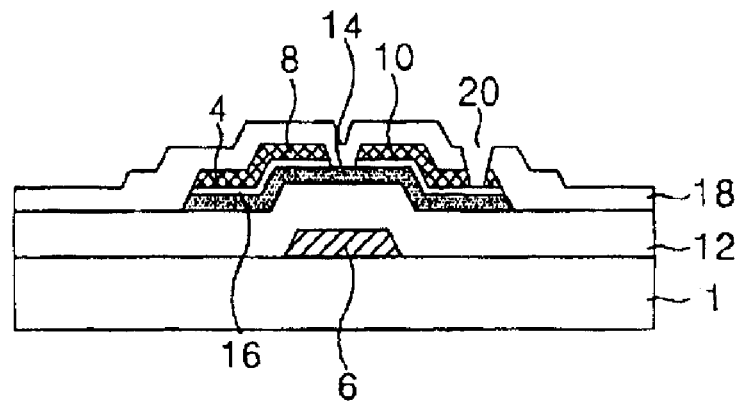
Figure 3D:
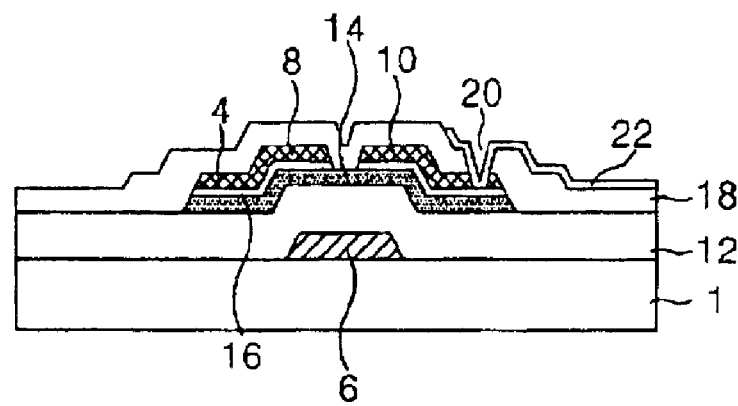
Figure 4:
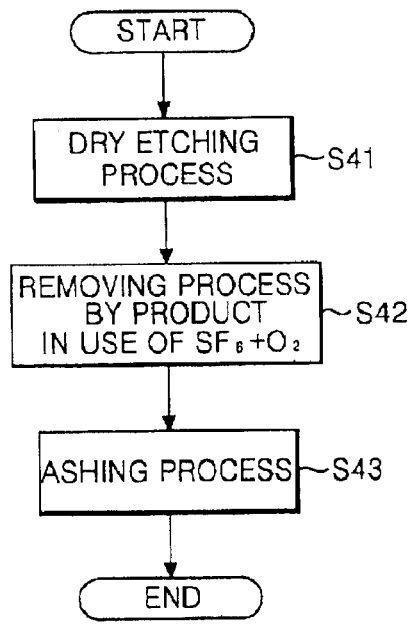
FIG. 4 is a flow chart representing a process to eliminate a process byproduct generated during a dry etching process and an ashing process of the liquid crystal display according to the related art.
Figure 5:
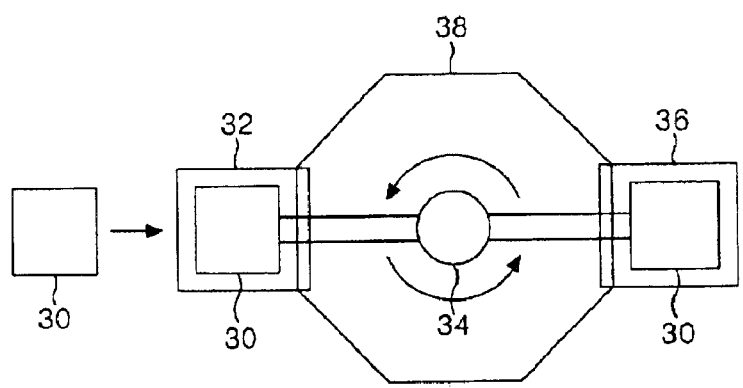
FIG. 5 is a diagram representing a fabricating apparatus of a liquid crystal display according to an embodiment of the present invention.

FIG. 5 is a diagram representing a fabricating apparatus of a liquid crystal display according to an embodiment of the present invention. As shown in FIG. 5, the fabricating apparatus of a liquid crystal display according to this example includes cassettes 32 loaded with substrates 30, a chamber 36 where a dry etching process or a wet etching process is performed for forming a pattern on the substrate 30, and a transferring chamber 38 to supply the substrate 30 from the cassettes 32 to the chambers 36. A plurality of substrates 30 are stacked on the cassette 32, wherein photo resist patterns are formed on the substrates 30 to form a gate pattern, a data pattern, a semiconductor layer and a contact hole. The transferring chamber 38 is driven to rotate and has a robot arm 34 to transfer the substrate 30. In the vacuum chamber 36, a dry etching process or a ashing process is performed to form a corresponding pattern on the substrate 30 using the photo resist pattern formed on the substrate 30.

The robot arm 34 moves the substrate 30 into the vacuum chamber 36, wherein the substrate 30 has the photo resist pattern and a lower part film formed thereon. The lower part film is located at the lower part of the photo resist pattern. The lower part film formed at the lower part of the photo resist pattern is dry-etched within the vacuum chamber 36 in the same manner as the photo resist pattern, with process conditions, such as pressure, RF power and reactive gas in the vacuum chamber 36.

Figure 6:
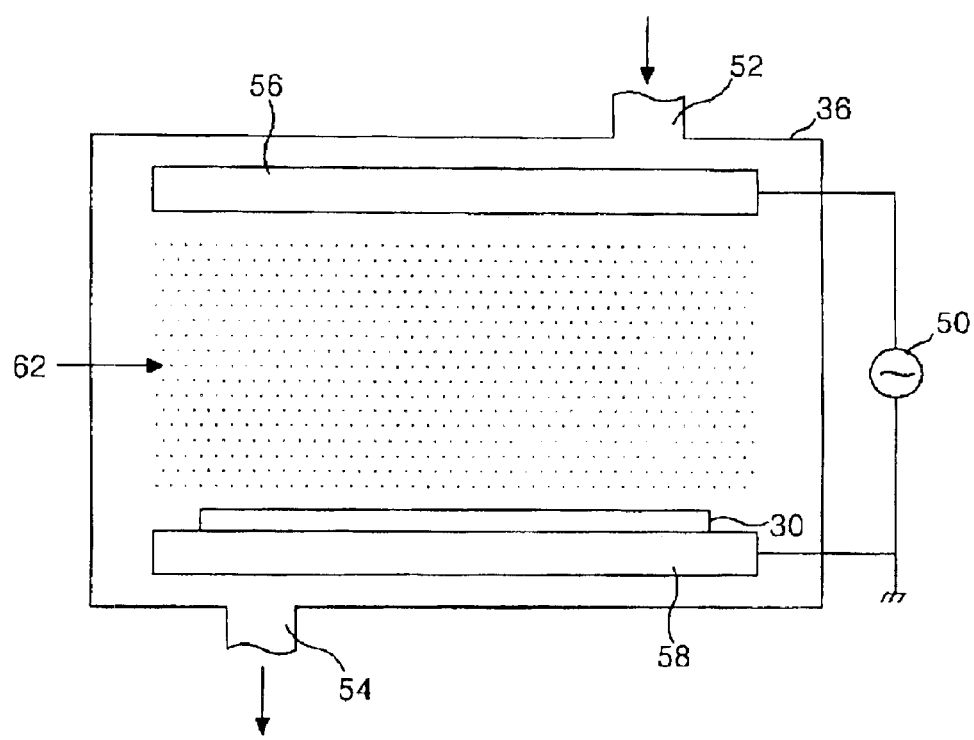
FIG. 6 is a diagram representing a vacuum chamber shown in FIG. 5.

FIG. 6 is a diagram representing a vacuum chamber shown in FIG. 5. As shown in FIG. 6, an anode substrate 56 and a cathode substrate 58 connected to a high-frequency generator 50 are installed in the vacuum chamber 36. Further, the chamber 36 includes a gas inlet 52 to inject gas and a gas outlet 54 to discharge gas.

The substrate 30 for the dry etching process and the ashing process is put on the cathode substrate 58. A reactive gas is injected through the gas inlet 52 into the vacuum chamber 36 that keeps a vacuum atmosphere, and a high-frequency electric field is applied between the anode substrate 56 and the cathode substrate 58 though the high-frequency generator 50. Accordingly, the reactive gas with the vacuum chamber 36 is ionized to a plasma state, then reacts with an etched material of the substrate 30 on the cathode substrate 58, and then generates a volatile material to perform the dry-etching process or the ashing process. Using such a fabricating apparatus for making a liquid crystal display, the dry-etching process or the ashing process is performed to form a contact hole on the protective layer and a channel layer between the source and drain electrode. A fabricating process for eliminating the process byproduct remaining within the chamber of the fabricating apparatus for the liquid crystal display, which can be performed for both the dry-etching and ashing processes, will be described with reference to FIG. 7.

Figure 7:
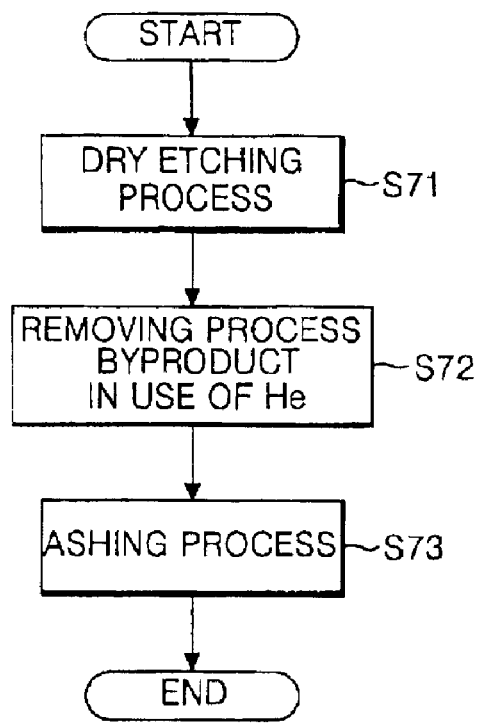
FIG. 7 is a flow chart representing a process to eliminate a process byproduct generated during a dry etching and ashing processes for making a liquid crystal display according to an embodiment of the present invention.

FIG. 7 is a flow chart representing a process to eliminate a process byproduct generated during a dry etching and ashing processes for making a liquid crystal display according to the present example. As shown in FIG. 7, a dry etching process for a first substrate is performed within a chamber in order to form a gate pattern and a contact hole (step S71). After completion of the dry etching process, the substrate in the chamber is moved into another transferring chamber, then a process byproduct and a remaining gas are eliminated using of inert gas at RF power by inserting a dummy substrate (step S72). At this moment, the inert gas, such as helium gas He etc., functions as refrigerant by decreasing any increase in temperature within the chamber. Then, the dummy substrate is moved to the transferring chamber. Then, a second substrate is inserted into the chamber for the ashing process, a photo resist pattern is ashed using $SF_6+O_2$ gas (step S73). The ratio of $SF_6$ gas and $O_2$ gas used upon the ashing process preferably is about 1:20.

Figure 8:
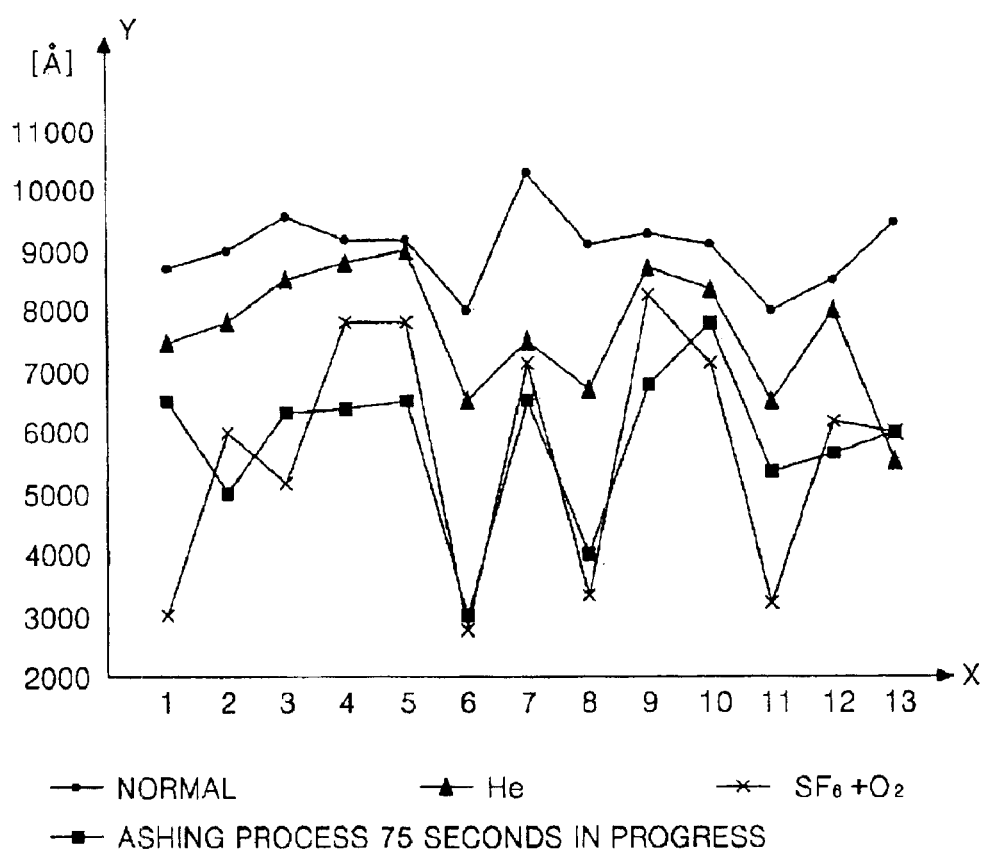
FIG. 8 is a graph showing the measured extent of ashing of the photo resist pattern within the chamber after performing the byproduct elimination processes in accordance both the related art and the present invention.

FIG. 8 is a graph showing the measured extent of ashing of the photo resist pattern within the chamber after the process byproduct elimination process for both the related art and the present invention. The Y-axis of the graph in FIG. 8 represents the thickness of the remaining photo resist pattern after the ashing process, and the X-axis represents the location of the substrate where the photo resist pattern is formed.

Figure 9:
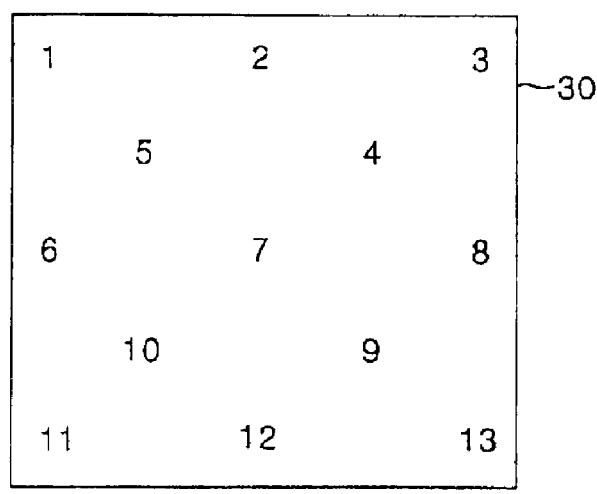
FIG. 9 is a diagram representing numbers applied in accordance with the location of a substrate.

As shown in FIG. 8, the thickness of the remaining photo resist pattern on the substrate after the ashing process is performed normally is about 8000~12000 angstroms in accordance with the location of the substrate. At this moment, the photo resist pattern formed at positions six and eleven is formed to have the thinnest thickness of about 8000 angstroms, wherein the positions six and eleven are located on the side of the substrate 30 shown in FIG. 9.

On the other hand, after the process byproduct elimination process is performed using the related art $SF_6+O_2$ gas, the photo resist pattern remaining on the ashed substrate 30 is more excessively ashed than the remaining photo resist pattern in the ashing process normally performed. In particular, the photo resist pattern formed at the positions six and eleven of the substrate 30 is excessively ashed, thereby leaving only about 3000 angstroms in thickness. Further, if the ashing process is performed with an ashing gas ($SF6:O2=1:20$) for 75 seconds after inserting the dummy substrate into the chamber, the photo resist pattern remaining on the ashed substrate is more excessively ashed than the remaining photo resist pattern in the ashing process normally performed.

More specifically, because there is no object to be ashed when plasma discharge is taking place on a dummy substrate with no pattern thereon, most of the energy is converted into heat energy that increase the temperature within the chamber, thereby reducing the ashing time. The increased temperature causes the photo resist pattern to be ashed relatively excessively. In particular, the photo resist pattern formed at positions one, six, eight and eleven of the substrate 30 is excessively ashed, thereby leaving only about 3000 angstroms in thickness.

Whereas, after the process byproduct elimination process is performed using He gas according to the present invention, the photo resist pattern remaining on the ashed substrate 30 is formed to be closer to the remaining photo resist pattern in the ashing process normally performed, as compared with that using the related art $SF_6+O_2$ gas. Thus, the elimination process of the remaining process byproduct using He gas damages the photo resist pattern relatively less than the process byproduct elimination process performed using of $SF_6+O_2$ gas.

As described above, the fabricating method of the liquid crystal display according to the present invention removes the remaining process byproduct and the remaining gas within the chamber using inert gas before the ashing process. Accordingly, the remaining gas and process byproduct affecting to the ashing process can be eliminated from the chamber by the inert gas. Further, the inert gas decreases the temperature increase within the chamber so as to prevent the excessive ashing of the photo resist pattern.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A fabricating method of a liquid crystal display, comprising the steps of:
   inserting a first substrate into a chamber to perform a dry etching process;
   removing the first substrate from the chamber after completion of the dry etching process;
   inserting a dummy substrate into the chamber;
   injecting inert gas into the chamber containing the dummy substrate to eliminate a process byproduct and a remaining gas from the chamber;
   taking the dummy substrate out from the chamber; and
   inserting a second substrate into the chamber having the process byproduct and the remaining gas removed, to perform an ashing process.

2. The fabricating method according to claim 1, wherein the step of performing the dry etching process includes:
   dry-etching a gate metal layer that is deposited on the first substrate.

3. The fabricating method according to claim 1, wherein the step of performing the dry etching process includes:
   dry-etching a protective film that is deposited on the first substrate.

4. The fabricating method according to claim 1, wherein the inert gas includes at least helium gas (He).

5. The fabricating method according to claim 1, wherein the step of performing the ashing process includes:
   making a photo resist pattern thinner, wherein the photo resist pattern is formed on the second substrate.

6. The fabricating method according to claim 5, wherein the photo resist pattern overlaps a channel part of a thin film transistor formed on the second substrate.

7. The fabricating method according to claim 1, wherein the step of performing the ashing process is performed using an ashing gas injected into the chamber, the ashing gas includes $SF_6$ gas and $O_2$ gas.

8. The fabricating method according to claim 7, wherein a $SF_6$ gas to $O_2$ gas ratio is 1:20.

9. A fabricating method of a liquid crystal display, comprising the steps of:
   inserting a first substrate into a chamber;
   performing a dry etching process with a process gas on the first substrate that results in a process byproduct and a remaining process gas in the chamber;
   removing the first substrate from the chamber after completion of the dry etching process;
   inserting a dummy substrate into the chamber;
   flowing inert gas through the chamber containing the dummy substrate to remove remaining process gas from the chamber;
   removing the dummy substrate from the chamber; and
   inserting a second substrate into the chamber;
   performing an ashing process on the second substrate.

10. The fabricating method according to claim 9, wherein the step of performing the dry etching process includes:
    dry-etching a gate metal layer that is deposited on the first substrate.

11. The fabricating method according to claim 9, wherein the step of performing the dry etching process includes:
    dry-etching a protective film that is deposited on the first substrate.

12. The fabricating method according to claim 9, wherein the inert gas includes at least helium gas.

13. The fabricating method according to claim 9, wherein the step of performing the ashing process includes:
    making a photo resist pattern thinner, wherein the photo resist pattern is formed on the second substrate.

14. The fabricating method according to claim 9, wherein the first substrate and second substrate are the same substrate.

15. The fabricating method according to claim 9, wherein a $SF_6$ gas to $O_2$ gas ratio is 1:20.

16. A fabricating method of a liquid crystal display, comprising the steps of:
    inserting a first substrate into a chamber;
    performing a first process on the first substrate;
    removing the first substrate from the chamber after completion of the first process;
    inserting a dummy substrate into the chamber;
    applying RF power to the dummy substrate in the chamber:
    cooling the chamber containing the dummy substrate with an inert gas;
    removing the dummy substrate from the chamber; and
    inserting a second substrate into the chamber;
    performing an ashing process on the second substrate.

17. The fabricating method according to claim 16, wherein the inert gas includes at least helium gas.

18. The fabricating method according to claim 16, wherein the step of performing the ashing process includes:
    making a photo resist pattern thinner, wherein the photo resist pattern is formed on the second substrate.

19. The fabricating method according to claim 16, wherein the first substrate and second substrate are the same substrate.

20. The fabricating method according to claim 16, wherein a $SF_6$ gas to $O_2$ gas ratio is 1:20.

* * * * *